United States Patent [19]
Murata

[11] Patent Number: 5,497,478
[45] Date of Patent: Mar. 5, 1996

[54] MEMORY ACCESS SYSTEM AND METHOD MODIFYING A MEMORY INTERLEAVING SCHEME SO THAT DATA CAN BE READ IN ANY SEQUENCE WITHOUT INSERTING WAIT CYCLES

[75] Inventor: Koh Murata, Tokyo, Japan

[73] Assignee: Hewlett-Packard Company, Palo Alto, Calif.

[21] Appl. No.: 381,465

[22] Filed: Jan. 31, 1995

Related U.S. Application Data

[63] Continuation of Ser. No. 850,590, Mar. 13, 1992, abandoned.

[30] Foreign Application Priority Data

Mar. 20, 1991 [JP] Japan ..................... 3-081827

[51] Int. Cl.[6] ................................... G06F 12/06
[52] U.S. Cl. .............. 395/484; 395/454; 395/427; 364/246.4; 364/251; 364/966.3; 364/DIG. 1; 364/DIG. 2
[58] Field of Search ................... 395/425, 484, 395/454, 246.4

[56] References Cited

U.S. PATENT DOCUMENTS

| 3,588,839 | 6/1971 | Belady et al. | 395/425 |
|---|---|---|---|
| 3,866,183 | 2/1975 | Lange | 395/725 |
| 4,056,845 | 11/1977 | Churchill, Jr. | 395/425 |
| 4,800,535 | 1/1989 | McAlpine | 371/51.1 |
| 4,918,587 | 4/1990 | Pechter et al. | 395/400 |
| 5,051,889 | 9/1991 | Fung et al. | 395/425 |
| 5,142,638 | 8/1992 | Schiffleger | 395/425 |
| 5,179,680 | 1/1993 | Colwell et al. | 395/425 |
| 5,247,644 | 9/1993 | Johnson et al. | 395/425 |
| 5,274,788 | 12/1993 | Koike | 395/425 |
| 5,323,489 | 6/1994 | Bird | 395/425 |
| 5,335,336 | 8/1994 | Kametani | 395/425 |

OTHER PUBLICATIONS

Hill, Frederick J., et al., *Digital Systems: Hardware Organization And Design*, 2nd ed., John Wiley & Sons, New York, 1978, pp. 561–563.

Primary Examiner—Tod R. Swann
Assistant Examiner—Frank J. Asta

[57] ABSTRACT

A memory access system and method is provided to modify a memory interleaving scheme so that data can be read from a memory system in any sequence without inserting a waiting cycle. Even addressees are assigned to a first memory bank and odd addresses to a second memory bank. If a sequential address sequence is being provided, the first and second memory banks are read alternately. A third memory bank is provided which has the contents of both first and second memory banks. When an address sequence is detected that successively accesses either the first memory bank or the second memory bank, the access is switched to the third memory bank.

11 Claims, 3 Drawing Sheets

MEMORY ACCESS SYSTEM AND METHOD MODIFYING A MEMORY INTERLEAVING SCHEME SO THAT DATA CAN BE READ IN ANY SEQUENCE WITHOUT INSERTING WAIT CYCLES

This is a continuation of application Ser. No. 07/850,590, filed Mar. 13, 1992, now abandoned.

FIELD OF THE INVENTION

This invention relates to, but is not limited to, a memory accessing system for reading at a high speed a memory that stores data for generating a digital data stream.

BACKGROUND OF THE INVENTION

In order to read a memory in which data for generating a digital data stream is stored, a series of addresses must be provided to the memory in the order in which the individual data elements representing the digital data stream are stored in the memory. Generation of such a digital data stream is necessary, for example, for generating a logic pattern for logic circuit testing or for generating an arbitrary waveform for analog (or analog-digital mixed) circuit testing.

In recent years, the operating speeds and complexity of the devices under test such as ICs have grown, the frequencies needed for testing signals has become higher, and longer test patterns have become required for this type of testing. Therefore, it has also been necessary to speed up the available data rate and to increase the amount of data associated with the testing signals.

One simple technique for satisfying the above requirements might be to use a high-speed and large capacity memory for generating the digital data streams. However, memory elements having an extremely short access time are typically unavailable. Even if available, an attempt to increase the capacity would increase the cost, heat generated, mounting area, and the like to an unacceptable level.

To solve the above problem, a memory interleaving scheme is usually employed. In this scheme, a plurality of mutually independently operating memory banks (usually, a power of 2 number of memory banks, such as 2, 4, 8, etc.) are provided, and addresses are assigned to the respective memory banks in a manner of traversing around these memory banks in sequence so that successive addresses are not assigned to any one memory bank. For example, in a two-way interleaving scheme in which two memory banks are used, even and odd addresses are assigned to banks "0" and "1" respectively so that accesses to any consecutive addresses are distributed to banks "0" and "1" in an alternating manner. In this case, the access time of each memory bank is allowed to be as long as twice the access time required for the entire memory system insofar as alternating accessing is carried out. Likewise, the access times of four times and eight times are allowed in four-way and eight-way interleaving schemes respectively. Therefore, a high-speed memory system can be constructed using memory elements of a slow access time, but low cost, high capacity, low power dissipation as well as high availability.

However, during the generation of a digital data stream to be used for generation of the testing signal, it is not usually allowed to insert a wait cycle within the data stream for the convenience of the memory. Therefore, there exist some sequences of data which cannot be generated using the memory interleaving scheme as described above.

For example, with the memory employing the two-way interleaving exemplified as above, the data stream which requires the reading sequence indicated below cannot be generated without inserting wait cycles therein: the address sequence is 0→1→2→0→1→2→0→1→2→3→. . .

This is problematic since it is necessary to read from address 0 immediately after reading from address 2, in which case it is needed to make successive accesses to the memory bank to which the even addresses are assigned (memory bank 0).

Therefore, when employing the interleaving scheme described above, there remains a restriction on the data streams that can be generated.

SUMMARY OF THE INVENTION

An object of this invention is to solve the above-described problem of the prior art, and to make it possible to generate a digital data stream in any arbitrary sequence at a high rate without inserting wait cycles even when using low-speed memory elements.

In accordance with one embodiment of the invention, in addition to providing a plurality of memory banks to perform memory accessing in a memory interleave scheme, there is further provided an additional memory bank which is accessed when a consecutive address sequence makes it necessary to access the memory bank in an interval shorter than the memory bank is capable. A duplication of at least part of the contents of the plurality of memory banks is stored in the additional memory bank.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION OF THE INVENTION

Figure 1:
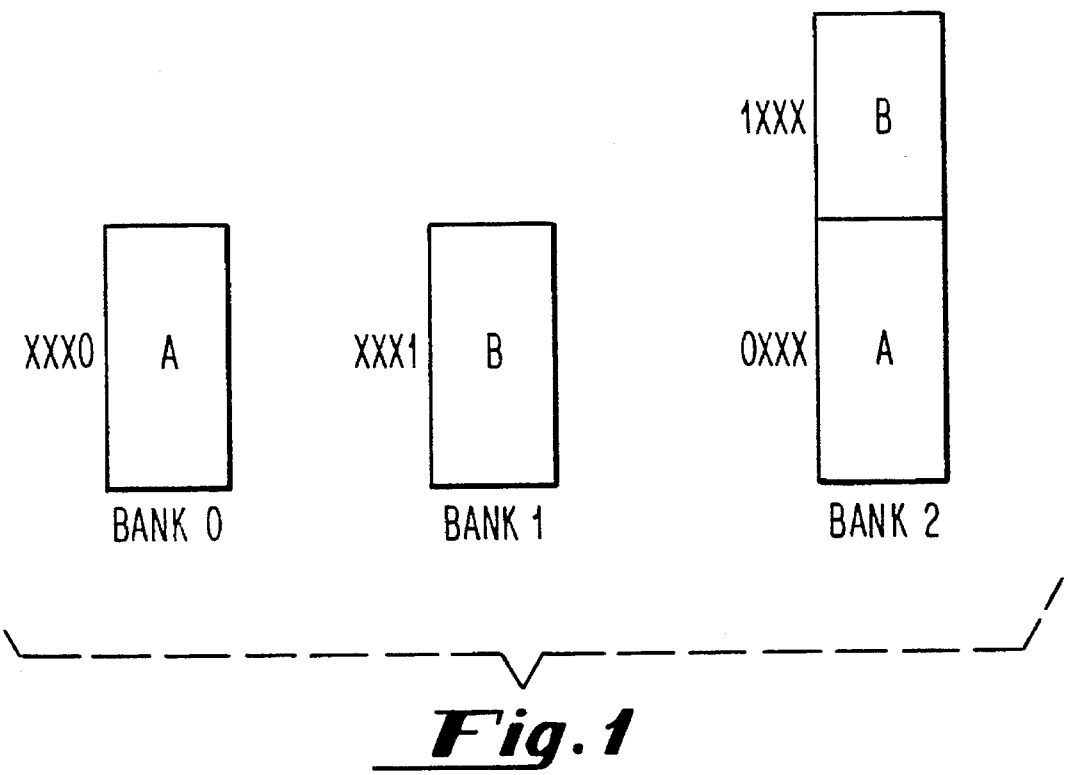
FIG. 1 is a conceptual block diagram of one embodiment of the present invention.

FIG. 1 is a conceptual block diagram of one embodiment of the memory accessing system modifying a two-way memory interleaving scheme. A data stream is generated by reading data from memory banks 0, 1 and 2. It is assumed that even and odd addresses are assigned respectively to banks 0 and 1, as described in the section background above. As long as an address sequence is given in which even and odd addresses appear alternately, banks 0 and 1 are alternately accessed, resulting in a data stream which is read with approximately a half time interval of the cycle time of each memory bank, (i.e., equivalent to the conventional memory interleaving scheme). In order to perform such an accessing operation, bank 0 is accessed if the LSB of a given address A $(=a_n \ldots a_2 a_1 a_0)$, i.e., $a_0$, is "0", and bank 1 is accessed if the LSB of address A or $a_0$ is "1" (in the specification of the present application, it is assumed that the address is in binary representation). The given address with the LSB removed may be used as the address within each bank.

With an address sequence in which consecutive even or consecutive odd addresses appear, the corresponding memory bank cannot be read without inserting a wait cycle, as explained above. When such a sequence is detected, the target of the memory access is switched to memory bank 2 that serves as the auxiliary memory bank.

Bank 2 has twice as much capacity of each of banks 0 and 1, and the contents of both memory banks 0 and 1 is stored therein.

The memory contents of bank 2 is set up such that if the memory content at intra-bank address $A0(=a_n \ldots a_2 a_1)$ of memory bank 0 is X, bank 2 also contains X at its intra-bank address of A0 with 0 concatenated at its head (MSB), $(=0\, a_n \ldots a_2\, a_1)$. With respect to bank 1, likewise, its memory content at intra-bank address $A1\ (=a_n \ldots a_2\, a_1)$ is identical to the content of bank 2 at its intra-bank address of A1 with 1 concatenated at the head.

Figure 2:
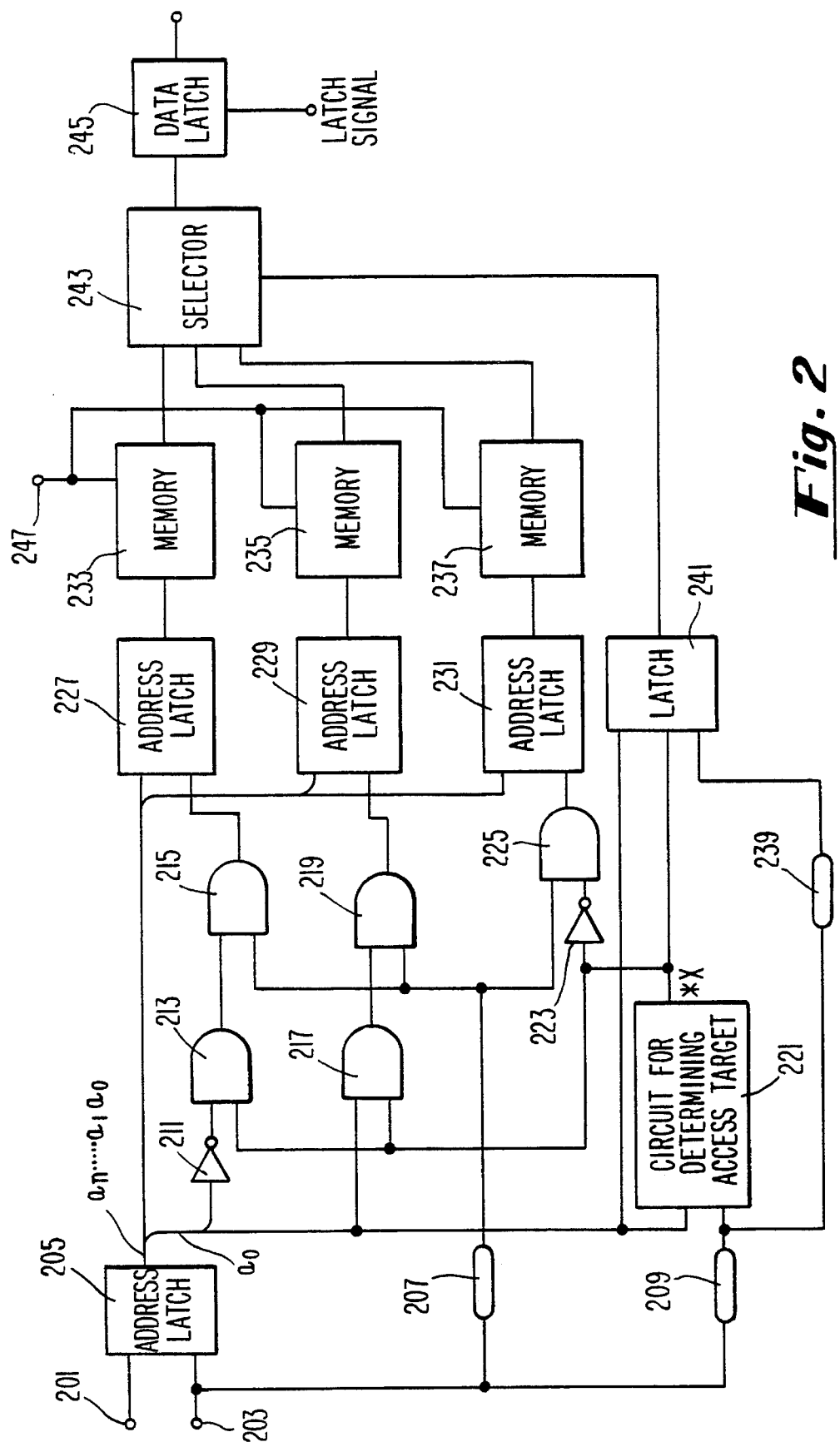
FIG. 2 shows an example of a circuit implementing a memory system operating in accordance with the embodiment of the present invention shown in FIG. 1.

FIG. 2 shows implementing the memory accessing system explained with reference to FIG. 1. In FIG. 2, an address supplied to address input 201 is temporarily latched into address latch 205 by the access timing pulse supplied at timing signal input 203. The latched address with the LSB removed, $(a_n \ldots a_1)$, is provided to address latches 227 and 229 for memory banks 233 and 235 which correspond respectively to memory banks 0 and 1. In addition, address latch 231 for memory 237 corresponding to bank 2 is provided with all the bits of the address, $(a_n \ldots a_1\, a_0)$. The LSB is supplied to a logic circuit comprising a NOT gate 211 and AND gates 213 through 219 for selecting one of the banks 0 and 1 to access. The output of the logic circuit enables one of the address latches 227 or 229 according to the LSB of the supplied address. Thus, while a sequence of addresses whose LSBs take 0 and 1 alternately, such as a sequential address sequence, the address latches 227 and 229 alternately latch these addresses.

In FIG. 2, there is also provided a circuit for determining access target 221 for switching from the memories 233 or 235 corresponding to banks 0 or 1, respectively to the memory 237 corresponding to bank 2 in the case where two consecutive accesses to the odd addresses or those to even addresses occur. Upon detection of such an event, the circuit 221 turns a switching signal *X to a low level, which in turn closes the AND gates 213 and 217, causing no enabling signals to be provided to the address latches 227 or 229. Instead, the AND gate 225 opens, providing an enable signal to the address latch 231. Thus, the address is latched in the address latch 231, allowing the memory 237 corresponding to bank 2 to be read. The LSB of the address is latched into the latch 241, which LSB is used to select the suitable one of the outputs of the memories 233,235 and 237 with selector 243 to latch into the data latch 245. The selection in the selector 243 is made as below:

| LSB | *X | |
|---|---|---|
| 0 | 1 | → output of the memory 233 |
| 1 | 1 | → output of the memory 235 |
| x | 0 | → output of the memory 237 ("x" denotes "don't care") |

The delay times of delay elements 207,209, and 239 are set appropriately so that the above operation may be carried out correctly as is known in the art. These delay elements are not limited to analog ones, and may be selected as required, such as the type in which the desired delay is achieved by means of combination of logic gates. Furthermore, though not shown, the latch signal for the data latch 245 is generated by suitably delaying the timing pulse supplied to the timing signal input 203 with a delay element. In addition, data writing is carried out by inputting a data stream through write data input 247 with addresses and access timing pulses provided appropriately.

Figure 3:
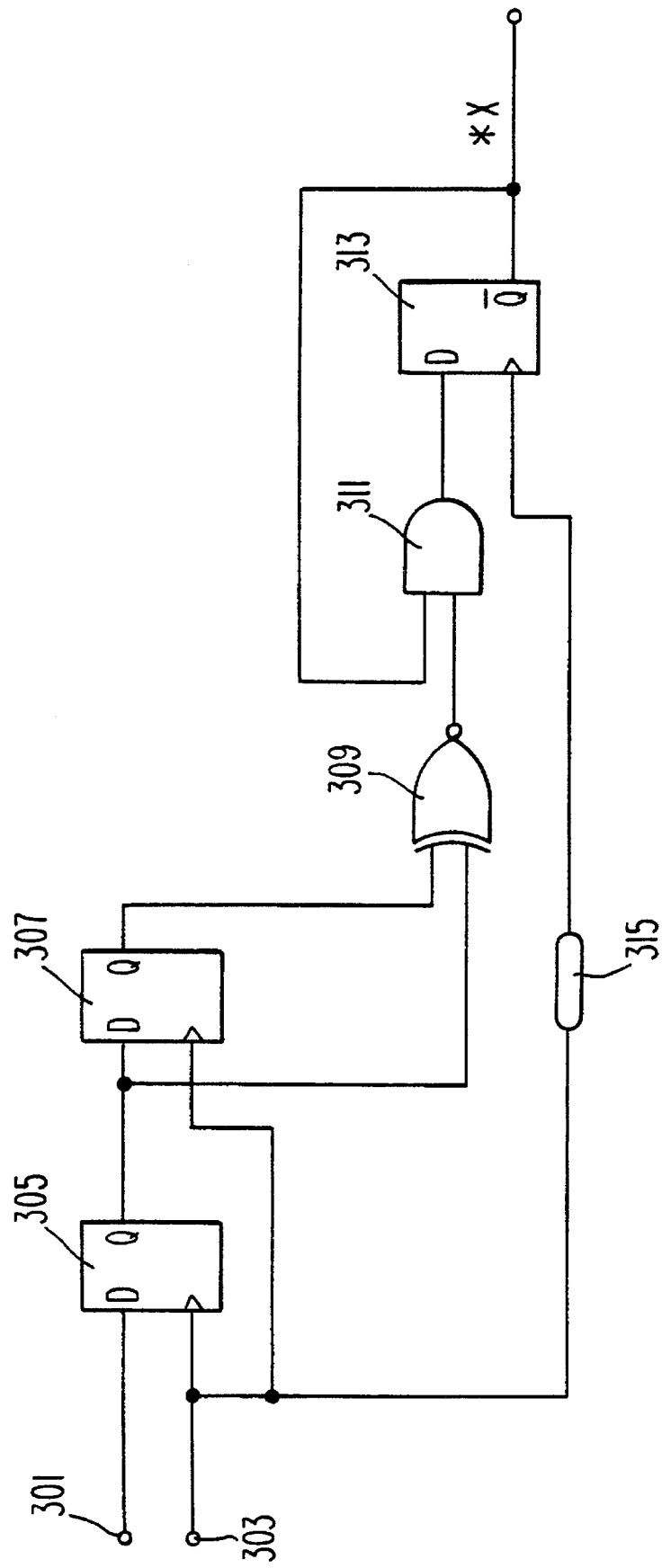
FIG. 3 shows a more detailed circuit for determining the accessing target used in FIG. 2.

FIG. 3 shows a more detailed circuit for determining access target 221. The LSB of the input address supplied through a LSB input is latched into latch 305 at a timing of the timing pulse delayed by the delay element 209. The current LSB latched into the latch 305 is compared with the previous LSB latched into latch 307 with XNOR gate 309, and an output "1" is supplied to AND gate 311 when these LSBs are coincident. AND gate 311 supplies a "1" to latch 313 only when the output of the XNOR gate 309 is a "1" (indicating that the previous and current LSBs are coincident) and the previous switching signal *X latched into the latch 313 is "1" (indicating that the previous accessing was not changed to bank 2). In other words, the instruction of changing the target of accessing is made by setting the current switching signal *X to "0".

Accordingly, given an address sequence in which, for example, four successive accesses to bank 1 are made, the actual accessing targets would be:

bank 1→bank 2→bank 1→bank 2, resulting in no successive accesses to any memory bank, which in turn enables a sufficient memory cycle time in these memory banks.

In the above embodiment, the auxiliary memory bank for avoiding the successive accesses to the ordinary memory banks stores a full copy of the contents of the ordinary memory banks. However, the auxiliary memory bank may store only a part of the contents, depending upon the characteristic of the address sequence to be supplied.

For example, assume that in the previous embodiment, the maximum number of successive addresses in the sequence to be provided in which LSBs take the same value is known a priori. Then, we can remarkably reduce the memory capacity of bank 2 by modifying the system in FIG. 1 in which the address provided to the memory system is used almost unchanged for the address to be provided to bank 2, to one in which the counter output as shown in FIG. 4 is used as the address.

Figure 4:
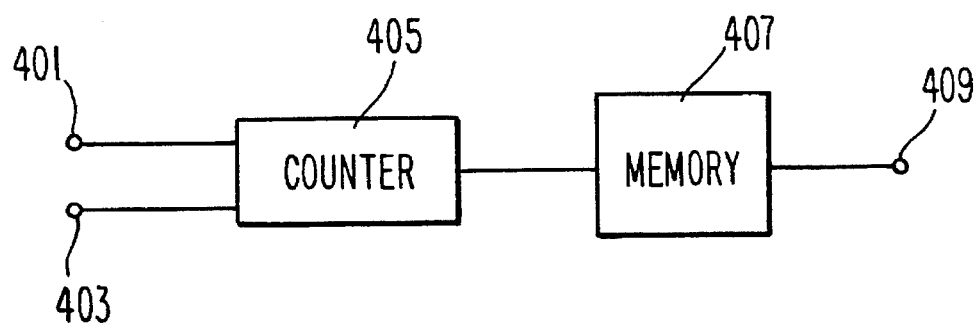
FIG. 4 shows a block diagram for generating the address for the auxiliary bank using a counter according to another embodiment of the present invention.

In FIG. 4, the initial count value is set via preload input 401 to counter 405, before the address sequence is provided to the memory system. While the address sequence is provided to the memory system, upon detection of successive accesses to bank 0 or 1 by the circuit for determining the access target 221 in FIG. 2, the access target will be changed to bank 2 and the access timing pulse for bank 2 will be provided to count up input 403 to the counter 405. This causes the count value to be incremented by the amount corresponding to one word. This count value is provided to the address input of memory 407 corresponding to bank 2, causing the data read from this address to appear as output 409 from the memory 407. By providing the initial value to the preload input 401 again on reaching the end of the address sequence, it is possible to repeatedly generate the desired data stream from the memory system. The initial count value could be the start address of bank 2, or in the case where bank 2 is large enough to be divided into partitions to store a plurality of sets of redirection addresses corresponding to various data streams, the start address of one of the partitions in which the desired data is stored may be employed as the initial count value.

If the address sequence to be given is previously known, the addresses in the sequence can easily be calculated which are to be redirected to bank 2. Therefore, if the contents of the addresses which receive the redirection are stored in bank 2 in sequence, then the desired result will be outputted from the memory system.

In this case, the counter 405 may also be used for writing into bank 2. Specifically, this can be done by providing each data to be written to the memory 407 (bank 2) in the same sequence as for reading, with the access timing pulse provided to the count-up input 403 for each data.

In addition, the memory interleaving used is not limited to a two-way scheme. The present invention may be applied to memory interleaving with a higher multiplicity, depending on the cycle time of the memory used as well as the data rate required by the memory system. In such a case, though a plurality of auxiliary memory banks are required and the control for switching the access to the auxiliary memory banks becomes more complicated than the two-way interleaving, it is all substantially the same as the two-way scheme. If sufficient time has not elapsed in the memory bank to be accessed since the last access thereto, the switching to the auxiliary memory bank will be executed.

As described above in detail, when generating a data stream at a high data rate using a low-speed memory, because the present invention allows even any arbitrary inconsecutive address sequence to effect the memory reading at a constant interval, it is very useful for the generation of circuit testing data or the like. Furthermore, as explained with reference to FIG. 4, depending upon the address sequence to be provided, the additional memory requirements for implementing the present invention may be reduced significantly. Moreover, the memory system for implementing the present invention has the construction of the conventional memory system employing the memory interleaving with the auxiliary memory bank(s) and the control circuit therefor added. Thus, the memory system can easily be converted back to the conventional construction in which only the memory interleaving is carried out, by removing the additional portion (or simply by omitting to install the memory of the auxiliary memory bank(s)). Therefore, such a low-cost version of memory systems may be manufactured with almost the same production process as the present invention, if these memory systems are previously known to be used only for the applications in which the conventional memory interleaving will suffice.

While the invention has been described and illustrated with reference to specific embodiments, those skilled in the art will recognize that modification and variations may be made without departing from the principles of the invention as described hereinabove and set forth in the following claims.

What is claimed is:

1. A memory system for outputting a sequence of digital words in response to a sequence of addresses comprising:

a plurality of mutually independently operating memory banks for storing digital words, each said digital word being stored in association with an address of at least one of said plurality of memory banks;

an auxiliary memory bank for storing a copy of at least some of said digital words stored within said plurality of memory banks, each of said at least some of said digital words being stored in association with an address of said auxiliary memory bank;

means for selecting one memory bank from said plurality of memory banks and said auxiliary memory bank by selecting said auxiliary memory bank instead of one of said plurality of memory banks when two consecutive addresses of said sequence of addresses are associated with a single one of said plurality of memory banks; and access means for accessing a digital word stored in said one memory bank in accordance with a current address of said sequence of addresses.

2. The system of claim 1, wherein said sequence of addresses is an arbitrary sequence and wherein said auxiliary memory bank stores all of said digital words stored within said plurality of memory banks.

3. A method of outputting a sequence of digital words in response to a sequence of addresses comprising:

storing said sequence of digital words in a plurality of memory banks, each said digital word being stored in association with an address of at least one of said plurality of memory banks the memory banks being accessed in an interleaving manner;

storing at least some of said digital words in an auxiliary memory bank, each of said at least some of said digital words being stored in association with an address of said auxiliary memory bank;

selecting one memory bank from said plurality of memory banks and said auxiliary memory bank by selecting said auxiliary memory bank instead of one of said plurality of memory banks when two consecutive addresses of said sequence of addresses are associated with a single one of said plurality of memory banks;

accessing a digital word stored in said one memory bank according to a current address of said sequence of addresses; and outputting each digital word so accessed from said one memory bank.

4. The method of claim 3, wherein said sequence of addresses is an arbitrary sequence and wherein said auxiliary memory bank stores all of said digital words stored within said plurality of memory banks.

5. A memory system for outputting a sequence of digital words with a constant interval between any two consecutive digital words in response to a sequence of addresses comprising:

a plurality of mutually independently operating memory banks for storing digital words, each said digital word being stored in association with an address of at least one of said plurality of memory banks;

an auxiliary memory bank for storing a copy of at least some of said digital words stored within said plurality of memory banks, each of said at least some of said digital words being stored in association with an address of said auxiliary memory bank;

selecting means for selecting one memory bank from said plurality of memory banks and said auxiliary memory bank by selecting said auxiliary memory bank instead of one of said memory banks if the time between consecutive accesses to said one memory bank does not exceed a predetermined time; and access means for accessing one of said digital words stored in said one memory bank in accordance with a current address of said sequence of addresses.

6. The system of claim 5, wherein said auxiliary memory bank stores each digital word stored within said plurality of memory banks.

7. The system of claim 5, wherein said auxiliary memory bank stores at least some of said digital words stored within said plurality of memory banks and wherein said sequence of digital words is known, the digital words stored in said auxilliary memory bank being the digital words that would be accessed within a time shorter than said predetermined time based upon the known sequence of digital words.

8. The system of claim 7 wherein said selecting means provides an output signal indicating that said auxiliary memory bank has been selected, said access means comprising:

counting means interfaced to receive said output signal from said selecting means for counting each time said output signal is received from said selecting means, and said counting means being additionally interfaced with said auxiliary memory bank and for providing an output to said auxiliary memory bank representative of an address of said auxiliary memory bank.

9. A method of outputting a sequence of digital words with a constant interval between consecutive digital words in response to a sequence of addresses comprising:

storing said sequence of digital words in a plurality of memory banks, each said digital word being stored in association with an address of at least one of said plurality of memory banks, the memory banks being accessed in an interleaving manner;

storing at least some of said digital words in an auxiliary memory bank, each of said at least some of said digital words being stored in association with an address of said auxiliary memory bank;

selecting one memory bank from said plurality of memory banks and said auxiliary memory bank, said auxiliary memory bank being selected instead of one of said memory banks if the time between consecutive accesses to said one memory bank does not exceed a predetermined time; and accessing a digital word stored in said one memory bank according to a current address, said one memory bank outputting said digital word in response to said accessing.

10. The method of claims 9, wherein said auxiliary memory bank stores each said digital word stored within said plurality of memory banks.

11. The method of claim 9, wherein said auxiliary memory bank stores at least some of said digital words stored within said plurality of memory banks and wherein said sequence of digital words is known, the digital words stored in said auxilliary memory bank being the digital words that are accessed within a time shorter than said predetermined time based upon the known sequence of digital words.

* * * * *